(12) United States Patent
Tsai et al.

(10) Patent No.: US 7,847,646 B2
(45) Date of Patent: Dec. 7, 2010

(54) CARRIER GENERATOR WITH LC NETWORK

(75) Inventors: Chun-Liang Tsai, Jhubei (TW);
Shao-Chang Chang, Jhubei (TW)

(73) Assignee: FAVEPC, Inc., Jhubei (TW)

( * ) Notice: Subject to any disclaimer, the term of this patent is extended or adjusted under 35 U.S.C. 154(b) by 79 days.

(21) Appl. No.: 12/127,527

(22) Filed: May 27, 2008

(65) Prior Publication Data

US 2009/0295491 A1 Dec. 3, 2009

(51) Int. Cl.
*H03B 1/00* (2006.01)
*H03C 3/02* (2006.01)

(52) U.S. Cl. .......................... 331/77; 332/141; 332/117

(58) Field of Classification Search .................. 331/74, 331/77, 167, 117 FE, 117 R, 179; 455/119, 455/126, 129; 332/100, 101, 102, 117, 127, 332/128, 126, 141
See application file for complete search history.

(56) References Cited

U.S. PATENT DOCUMENTS

| | | | |
|---|---|---|---|
| 4,339,750 A | 7/1982 | Delacruz | |
| 4,587,497 A | 5/1986 | Keller et al. | |
| 4,593,412 A | 6/1986 | Jacob | |
| 4,794,622 A | 12/1988 | Isaacman et al. | |
| 5,483,205 A | 1/1996 | Kawamura | |
| 5,973,412 A | 10/1999 | Nantz et al. | |
| 6,664,770 B1 | 12/2003 | Bartels | |
| 6,784,753 B2 * | 8/2004 | Leenaerts et al. | 331/36 C |
| 6,965,295 B2 | 11/2005 | Shimonomoto et al. | |
| 6,970,046 B2 * | 11/2005 | Da Dalt et al. | 331/16 |
| 7,068,991 B2 | 6/2006 | Parise | |
| 7,084,605 B2 | 8/2006 | Mickle et al. | |
| 7,286,070 B2 | 10/2007 | Zoso et al. | |
| 7,605,689 B2 | 10/2009 | Hein et al. | |

(Continued)

FOREIGN PATENT DOCUMENTS

JP  10-145229 A  5/1998

(Continued)

OTHER PUBLICATIONS

Office Action for U.S. Appl. No. 11/766,738 dated Sep. 17, 2010.

(Continued)

*Primary Examiner*—Robert Pascal
*Assistant Examiner*—Ryan Johnson
(74) *Attorney, Agent, or Firm*—Alston & Bird LLP

(57) ABSTRACT

A carrier generator for generating a carrier at a frequency of interest in a wireless communications system comprises an oscillator exhibiting a first impedance, the oscillator comprising an energy storage tank configured to generate a periodic signal, the energy storage tank including at least one inductor and at least one capacitor, and an amplifier coupled with the energy storage tank, the amplifier being configured to amplify an amplitude of the periodic signal, an antenna exhibiting a second impedance smaller than the first impedance, and a network coupled between the oscillator and the antenna, the network including at least one inductor or at least one capacitor and being configured to provide a third impedance such that a resultant impedance of the second impedance and the third impedance as viewed from the oscillator toward the antenna is large enough to facilitate the oscillator to generate the carrier at the frequency of interest.

7 Claims, 13 Drawing Sheets

U.S. PATENT DOCUMENTS

2007/0007821 A1    1/2007  Rossetti
2008/0298453 A1 *  12/2008 Lerner et al. ................ 375/233

FOREIGN PATENT DOCUMENTS

| | | |
|---|---|---|
| JP | 11-308285 A | 11/1999 |
| JP | 2002-118477 A | 4/2002 |
| JP | 2005-508104 T | 3/2005 |
| WO | WO 03/103164 A1 | 12/2003 |

OTHER PUBLICATIONS

Office Action for Japanese Application No. 2008-198569 dated Aug. 31, 2010.

* cited by examiner

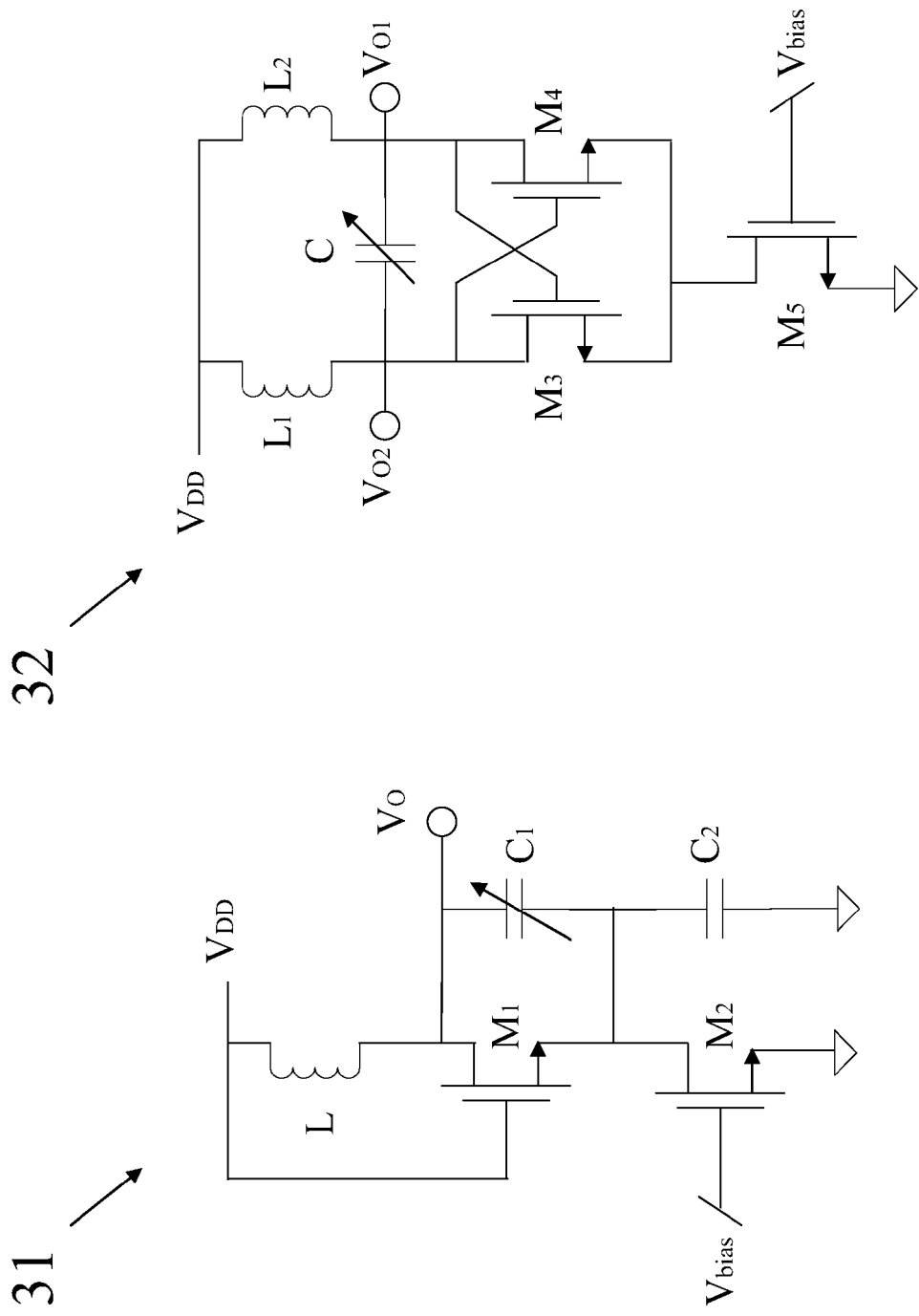

CARRIER GENERATOR WITH LC NETWORK

BACKGROUND OF THE INVENTION

The present invention generally relates to a transmitter and, more particularly, to a carrier generator for generating a carrier at a frequency of interest.

In a wireless communication system, information or data to be transmitted from a transmitter may be conveyed by a carrier generated by the transmitter. FIG. 1 is a schematic block diagram of a conventional wireless transmitter 10. Referring to FIG. 1, the wireless transmitter 10 may include a quartz crystal 11, a crystal circuit 12, a phase-frequency detector (PFD) 13, a charge pump (CP) 14, a low pass filter (LPF) 15, a voltage-controlled oscillator (VCO) 16, a divider 17, a power amplifier (PA) 18 and an antenna 19. The above-mentioned components 13 to 17 may form a phase-locked loop (PLL) circuit of the wireless transmitter 10. The PA 18, which may comprise active components, is used to drive an antenna and translate a signal level and may thus require a considerable amount of power during operation. A transmitter with the PA 18 may not satisfy the increasing demand for communication devices with low power consumption and low cost.

BRIEF SUMMARY OF THE INVENTION

Examples of the present invention may provide a carrier generator for generating a carrier at a frequency of interest in a wireless communications system. The carrier generator comprises an oscillator exhibiting a first impedance, the oscillator comprising an energy storage tank configured to generate a periodic signal, the energy storage tank including at least one inductor and at least one capacitor, and an amplifier coupled with the energy storage tank, the amplifier being configured to amplify an amplitude of the periodic signal, an antenna exhibiting a second impedance smaller than the first impedance, and an LC network coupled between the oscillator and the antenna, the LC network including at least one inductor or at least one capacitor and being configured to provide a third impedance such that a resultant impedance of the second impedance and the third impedance as viewed from the oscillator toward the antenna is large enough to facilitate the oscillator to generate the carrier at the frequency of interest.

Some examples of the present invention may also provide a carrier generator for generating a carrier at a frequency of interest in a wireless communications system. The carrier generator comprises a first oscillator configured to generate a first periodic signal at a first frequency, a second oscillator exhibiting a first impedance, the second oscillator comprising an energy storage tank configured to generate a second periodic signal based on the first periodic signal through an analog or digital adjustment circuit, the energy storage tank including at least one inductor and at least one capacitor, and an amplifier coupled with the energy storage tank, the amplifier being configured to amplify an amplitude of the second periodic signal, an antenna exhibiting a second impedance smaller than the first impedance, and an LC network coupled between the second oscillator and the antenna, the LC network including at least one inductor or at least one capacitor and being configured to provide a third impedance such that a resultant impedance of the second impedance and the third impedance as viewed from the second oscillator toward the antenna is large enough to facilitate the second oscillator to generate the carrier at the frequency of interest.

Examples of the present invention may further provide a carrier generator for generating a carrier at a frequency of interest in a wireless communications system. The carrier generator comprises a first oscillator configured to generate the carrier, the first oscillator exhibiting a first impedance, an antenna exhibiting a second impedance smaller than the first impedance, and an LC network coupled between the first oscillator and the antenna, the LC network being configured to provide a third impedance such that a resultant impedance of the second impedance and the third impedance as viewed from the first oscillator toward the antenna facilitates the first oscillator to generate the carrier at the frequency of interest.

BRIEF DESCRIPTION OF THE SEVERAL VIEWS OF THE DRAWINGS

The foregoing summary as well as the following detailed description of the preferred embodiments of the present invention will be better understood when read in conjunction with the appended drawings. For the purposes of illustrating the invention, there are shown in the drawings embodiments which are presently preferred. It is understood, however, that the invention is not limited to the precise arrangements and instrumentalities shown. In the drawings:

FIGS. 3A to 3E are circuit diagrams of exemplary oscillators of the carrier generator illustrated in FIG. 2;

DETAILED DESCRIPTION OF THE INVENTION

Reference will now be made in detail to the present examples of the invention illustrated in the accompanying drawings. Wherever possible, the same reference numbers will be used throughout the drawings to refer to the same or like portions.

Figure 1:
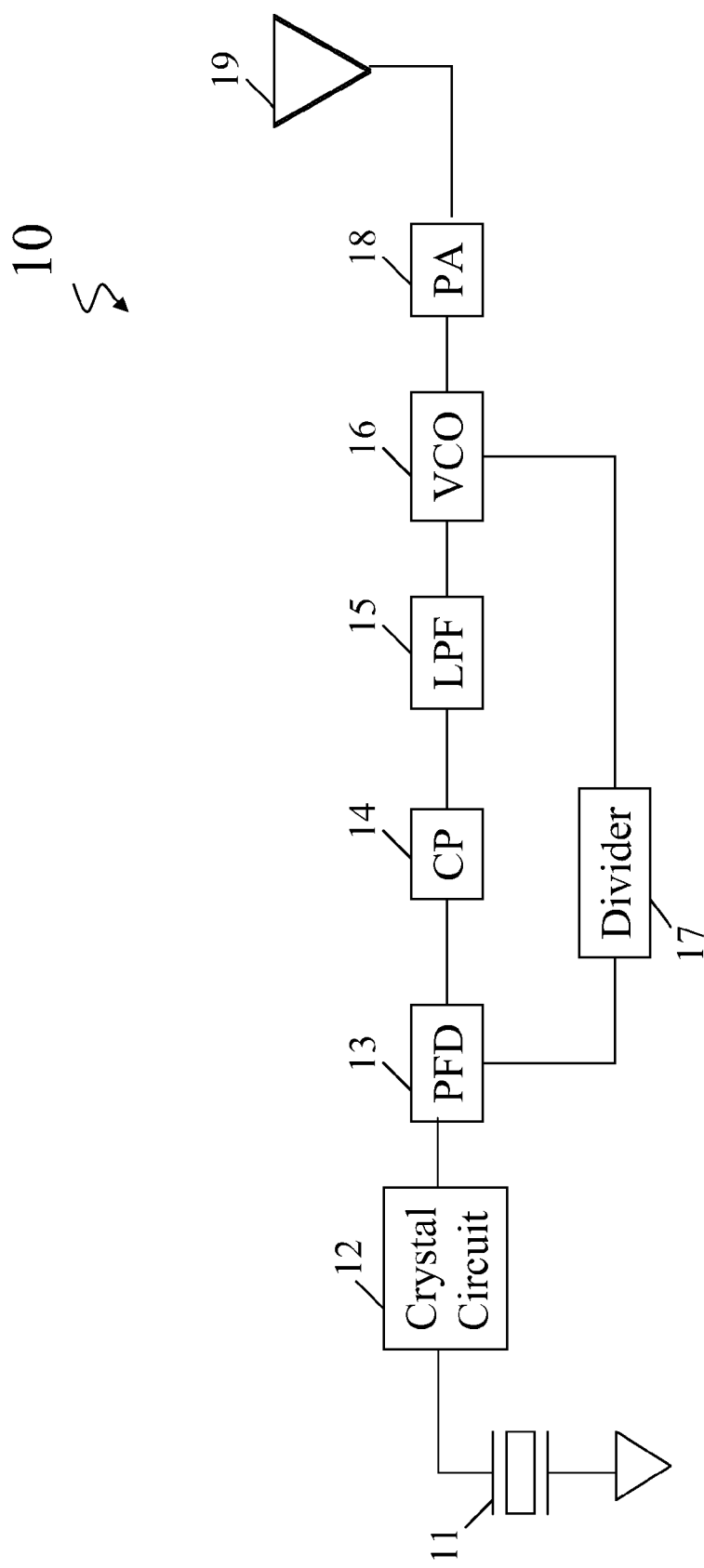
FIG. 1 is a schematic block diagram of a conventional wireless transmitter.
Figure 2:
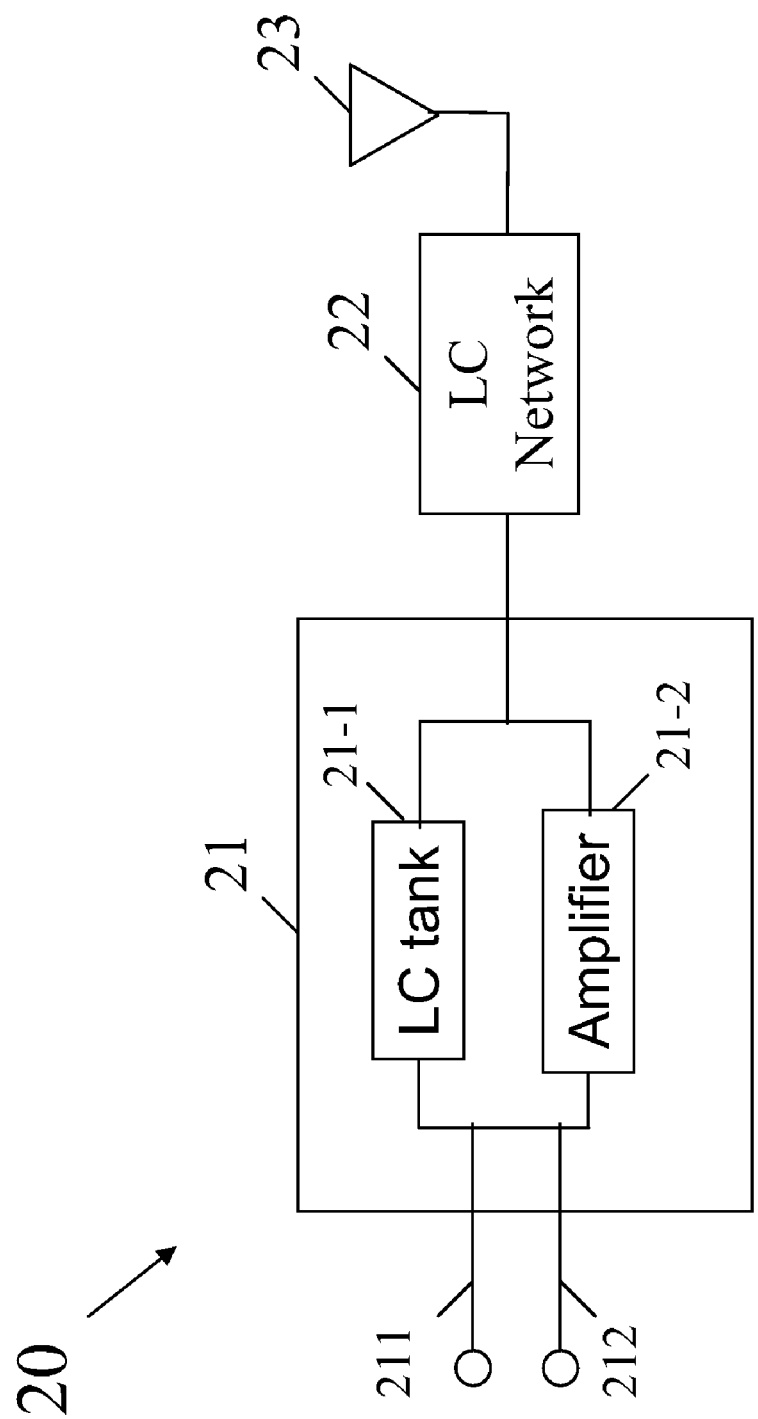
FIG. 2 is a schematic block diagram of a carrier generator consistent with an example of the present invention.

FIG. 2 is a block diagram of a carrier generator 20 consistent with an example of the present invention. Referring to FIG. 2, the carrier generator 20 may include an oscillator 21, an inductor and capacitor (hereinafter an "LC") network 22 and an antenna 23. The oscillator 21 may include an LC tank 21-1 and an amplifier 21-2. The LC tank 21-1 may serve as an energy storage and may further include one or more inductor and one or more capacitor. Based on the inductance "L" of the one or more inductor and the capacitance "C" of the one or more capacitor, a carrier frequency "f" of interest may be determined in an equation as given below.

$$f = \frac{1}{2\pi\sqrt{LC}}$$

In one example, the oscillator 21 may generate a carrier signal at a frequency ranging from approximately 300 to 400 megahertz (MHz) but the value may change to suit different applications.

The amplifier 21-2 may be configured to amplify the amplitude of the carrier signal. The oscillator 21 may further include one or more trimming pin 211 to adjust the carrier frequency, and a modulation pin 212 to receive a modulation signal from a modulator (not shown). A carrier signal from the oscillator 21 may be modified based on a modulation scheme of the modulator to convey a message to be transmitted via the antenna 23.

The LC network 22 may include one or more inductor, one or more capacitor or both. The LC network 22 may be configured to provide an impedance large enough to facilitate oscillation of the oscillator 21. In general, the antenna 23 may exhibit a resistance of, for example, approximately 50 ohms, which is a relatively low impedance. In the absence of the LC network 22, there may be an input impedance of about 50 ohms at an output of the oscillator 21 as viewed from the oscillator 21 toward the antenna 23. However, the oscillator 21 may itself exhibit a relatively high impedance. If the oscillator 21 is directly connected to the antenna 23, the low-impedance antenna 23 may attenuate the gain of the oscillator 21 such that the oscillator 21 may not be able to oscillate. By electrically coupling the LC network 22 between the oscillator 21 and the antenna 23, a resultant impedance "Z" viewed from the output of the oscillator 21 toward the antenna 23 may be given as follows.

$Z=R+jX$

Where the reactance "X" is the imaginary part of the resultant impedance, which may be contributed by the LC network 22. The impedance Z may be equal to $(R+jX_L)$ if the LC network 22 is comprised of one or more inductor, $X_L=2\pi f L$. Likewise, the impedance Z may be equal to $(R+jX_C)$ if the LC network 22 is comprised of one or more capacitor, $$X_C = \frac{-1}{2\pi f C}.$$

Moreover, the impedance Z may be equal to $[R+j(X_L+X_C)]$ if the LC network 22 includes one or more inductor and one or more capacitor.

Figure 3E:
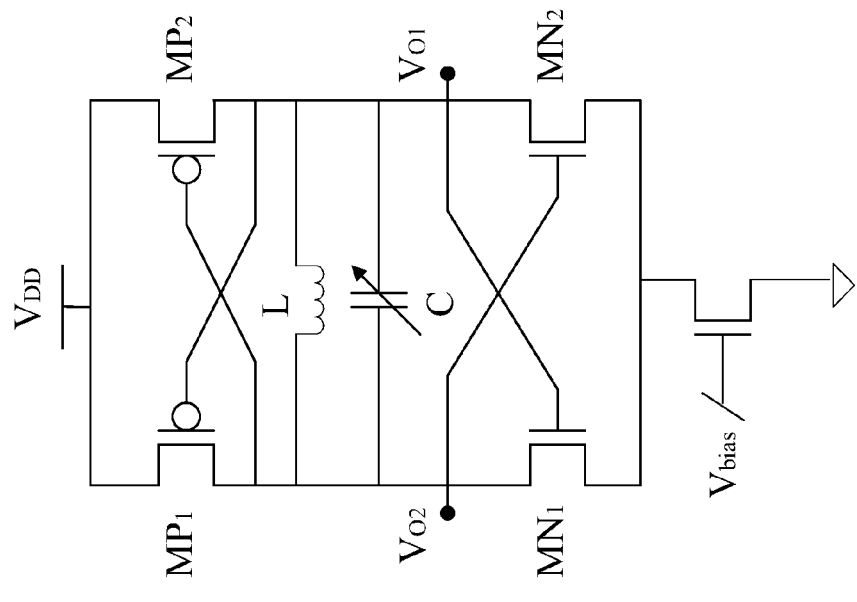

FIGS. 3A to 3E are circuit diagrams of exemplary oscillators 31 to 35 of the carrier generator 20 illustrated in FIG. 2. Referring to FIG. 3A, the oscillator 31 may include an LC tank comprising an inductor L and capacitors $C_1$ and $C_2$, and an amplifier comprising metal-oxide-semiconductor (MOS) transistors $M_1$ and $M_2$. At least one of the capacitors $C_1$ and $C_2$ may include a variable capacitor to ensure that the oscillator 31 may generate a carrier frequency of interest. The oscillator 31 has an output terminal $V_O$ coupled to the LC network 22 and may be called a "single-ended" oscillator.

Referring to FIG. 3B, the oscillator 32 may include an LC tank comprising inductors $L_1$ and $L_2$ and a variable capacitor C, and an amplifier comprising MOS transistors $M_3$, $M_4$ and $M_5$. The oscillator 32 has output terminals $V_{O1}$ and $V_{O2}$ each being coupled to an LC network such as the LC network 22 illustrated in FIG. 2 and may be called a "fully-differential" oscillator.

Figure 3C:
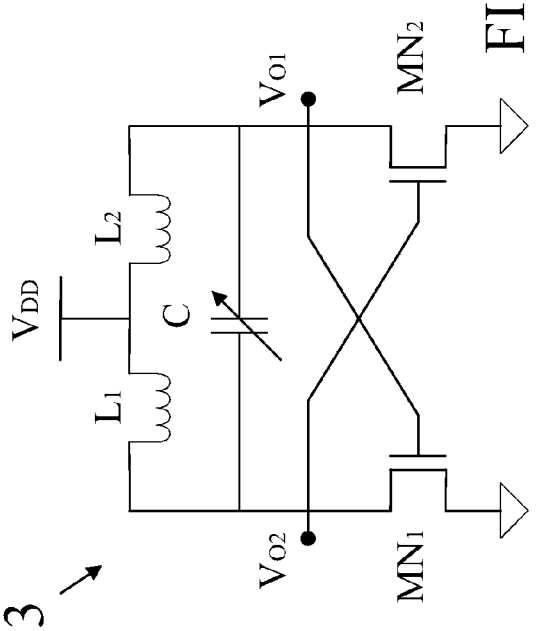

Referring to FIG. 3C, the oscillator 33 may include an LC tank comprising inductors $L_1$ and $L_2$ and a variable capacitor C, and an amplifier comprising n-type MOS (NMOS) transistors $MN_1$ and $MN_2$. The oscillator 33 may be called an NMOS-type oscillator.

Figure 3D:
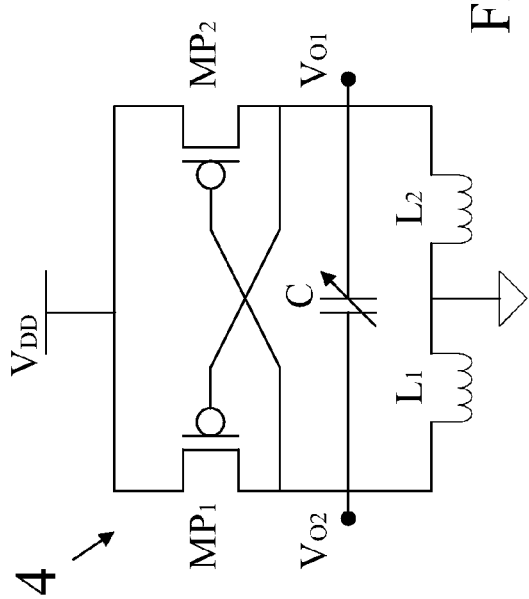

Referring to FIG. 3D, the oscillator 34 may include an LC tank comprising inductors $L_1$ and $L_2$ and a variable capacitor C, and an amplifier comprising p-type MOS (PMOS) transistors $MP_1$ and $MP_2$. The oscillator 34 may be called a PMOS-type oscillator.

Referring to FIG. 3E, the oscillator 35 may include an LC tank comprising an inductor L and a variable capacitor C, and an amplifier comprising NMOS transistors $MN_1$ and $MN_2$ and PMOS transistors $MP_1$ and $MP_2$. The oscillator 35 may be called a complementary MOS (CMOS)-type oscillator.

Figure 4B:
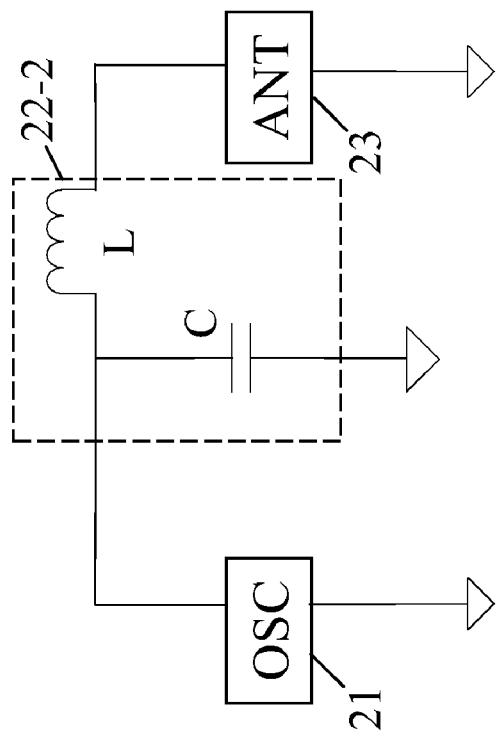
FIGS. 4A to 4H are circuit diagrams of exemplary LC networks of the carrier generator illustrated in FIG. 2.
Figure 4A:
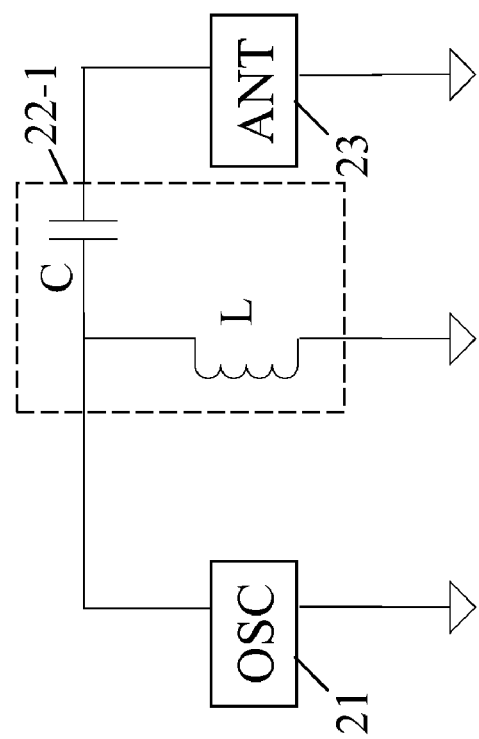

FIGS. 4A to 4H are circuit diagrams of exemplary LC networks 22-1 to 22-6 of the carrier generator 20 illustrated in FIG. 2. Referring to FIG. 4A, the LC network 22-1 may include a capacitor C coupled between the oscillator 21 and the antenna 23, and an inductor L coupled in parallel with the oscillator 21. The oscillator 21 may include a single-ended oscillator.

Referring to FIG. 4B, the LC network 22-2 may include an inductor L between the oscillator 21 and the antenna 23, and a capacitor C coupled in parallel with the oscillator 21.

Figure 4D:
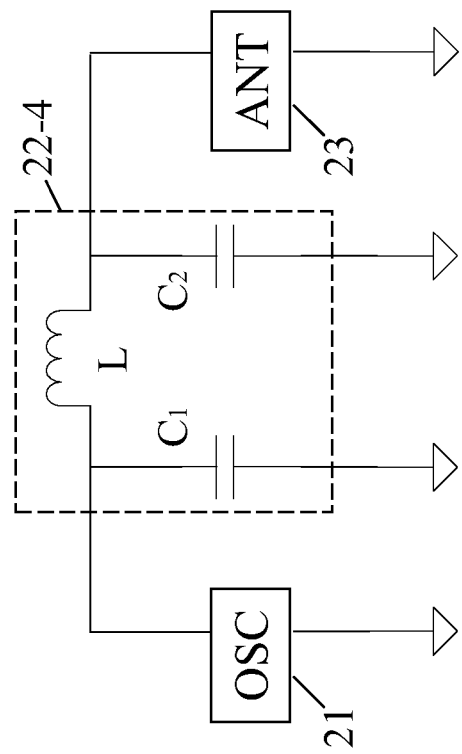
Figure 4C:
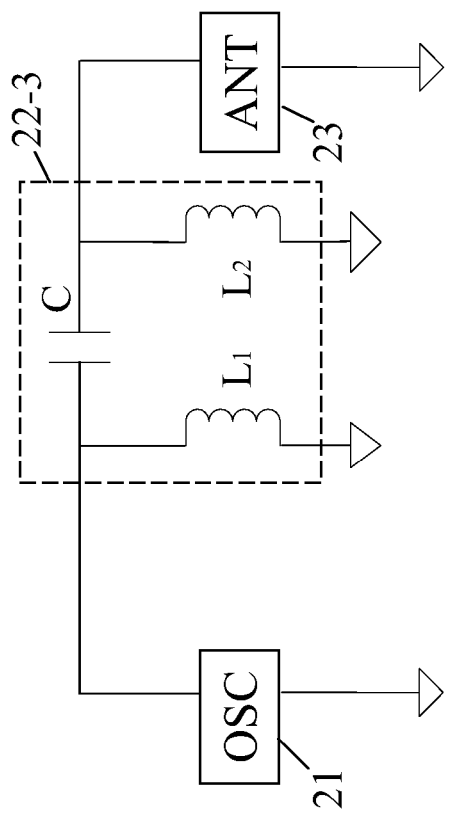

Referring to FIG. 4C, the LC network 22-3 may include a capacitor C coupled between the oscillator 21 and the antenna 23, and inductors $L_1$ and $L_2$ coupled in parallel with the oscillator 21.

Referring to FIG. 4D, the LC network 22-4 may include an inductor L coupled between the oscillator 21 and the antenna 23, and capacitors $C_1$ and $C_2$ coupled in parallel with the oscillator 21.

Figure 4F:
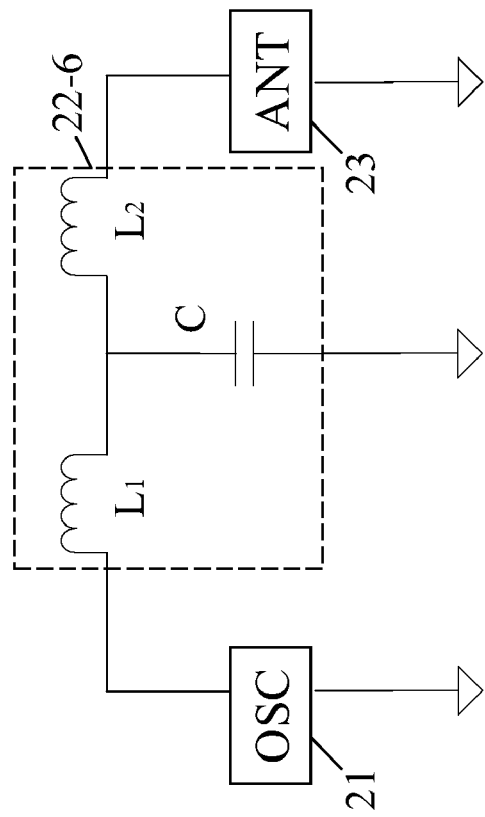
Figure 4E:
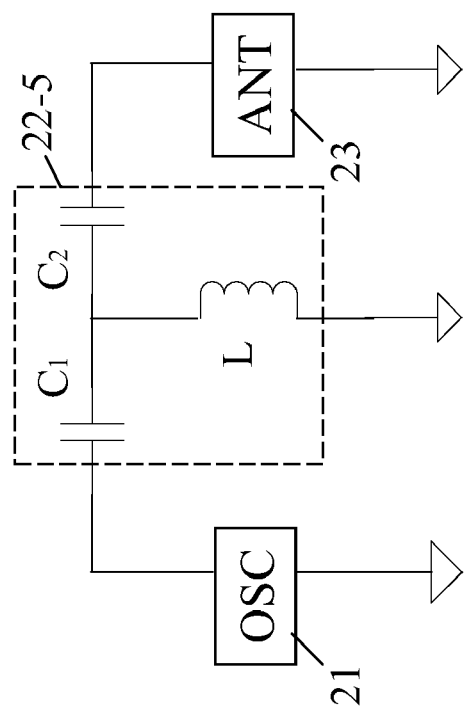

Referring to FIG. 4E, the LC network 22-5 may include capacitors $C_1$ and $C_2$ coupled in series between the oscillator 21 and the antenna 23, and an inductors L coupled in parallel with the oscillator 21.

Figure 4H:
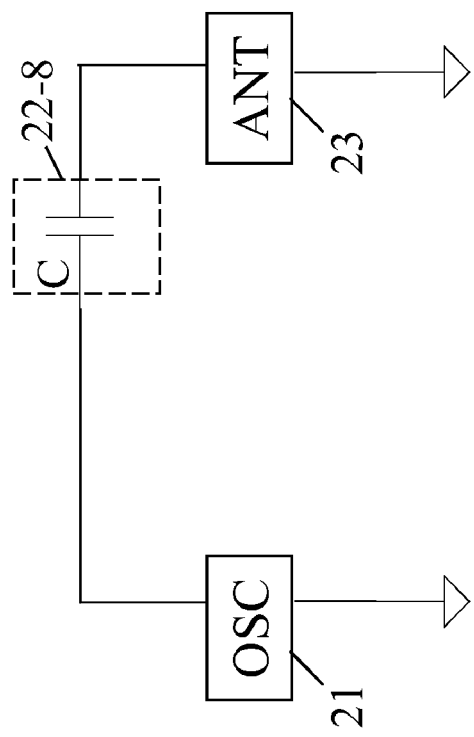
Figure 4G:
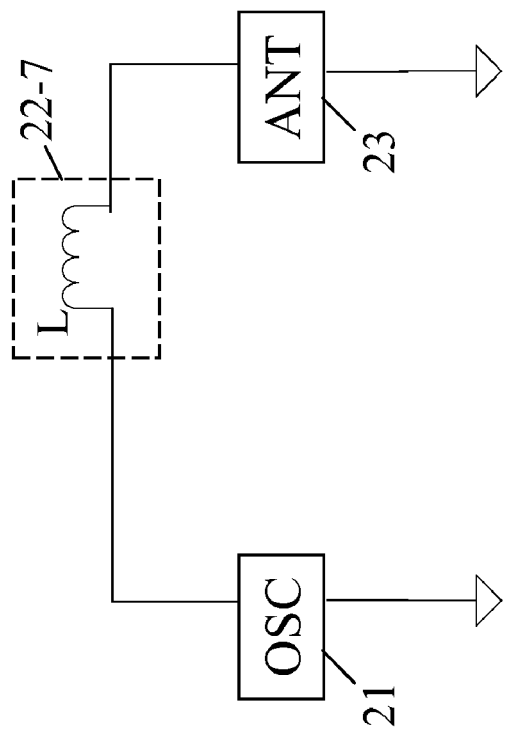

Referring to FIG. 4F, the LC network 22-6 may include inductors $L_1$ and $L_2$ coupled in series between the oscillator 21 and the antenna 23, and a capacitor C coupled in parallel with the oscillator 21. Skilled persons in the art will understand that a wide range of LC networks may be available for the LC network 22 illustrated in FIG. 2. For example, the LC network 22 may include only one inductor 22-7 as illustrated in FIG. 4G or only one capacitor 22-8 as illustrated in FIG. 4H. In other examples, the LC network 22 may include two or more capacitors and two or more inductors.

Figure 5:
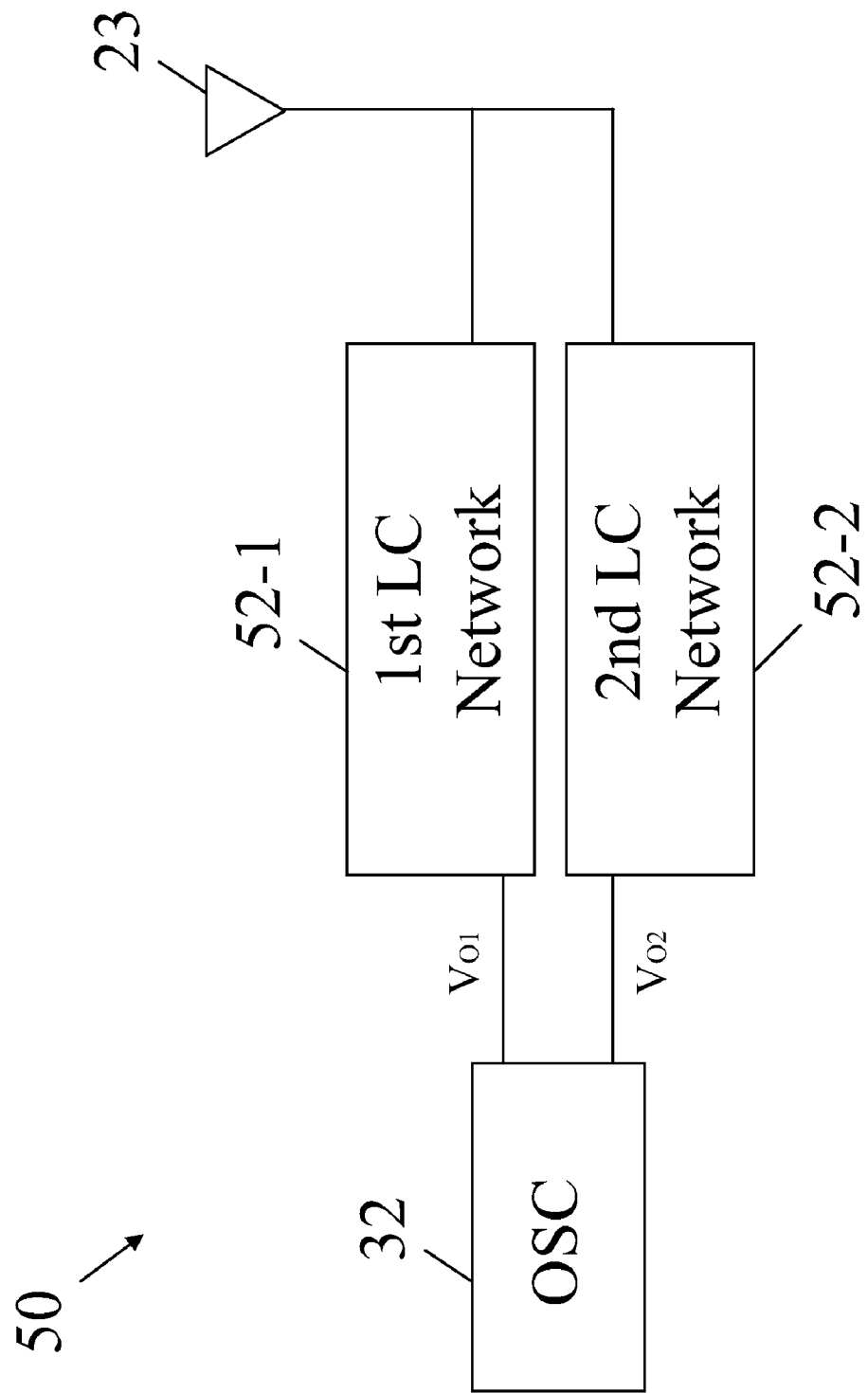
FIG. 5 is a schematic block diagram of a carrier generator consistent with another example of the present invention.

FIG. 5 is a schematic block diagram of a carrier generator 50 consistent with another example of the present invention. Referring to FIG. 5, the carrier generator 50 may include a fully-differential oscillator such as the oscillator 32 described and illustrated with reference to FIG. 3B. The oscillator 32 may have a first output $V_{O1}$ coupled to a first LC network 52-1 and a second output $V_{O2}$ coupled to a second LC network 52-2. Each of the first LC network 52-1 and the second LC network 52-2 may include one of the LC networks 22-1 to 22-8 described and illustrated with reference to FIGS. 4A to 4H, respectively.

Figure 6:
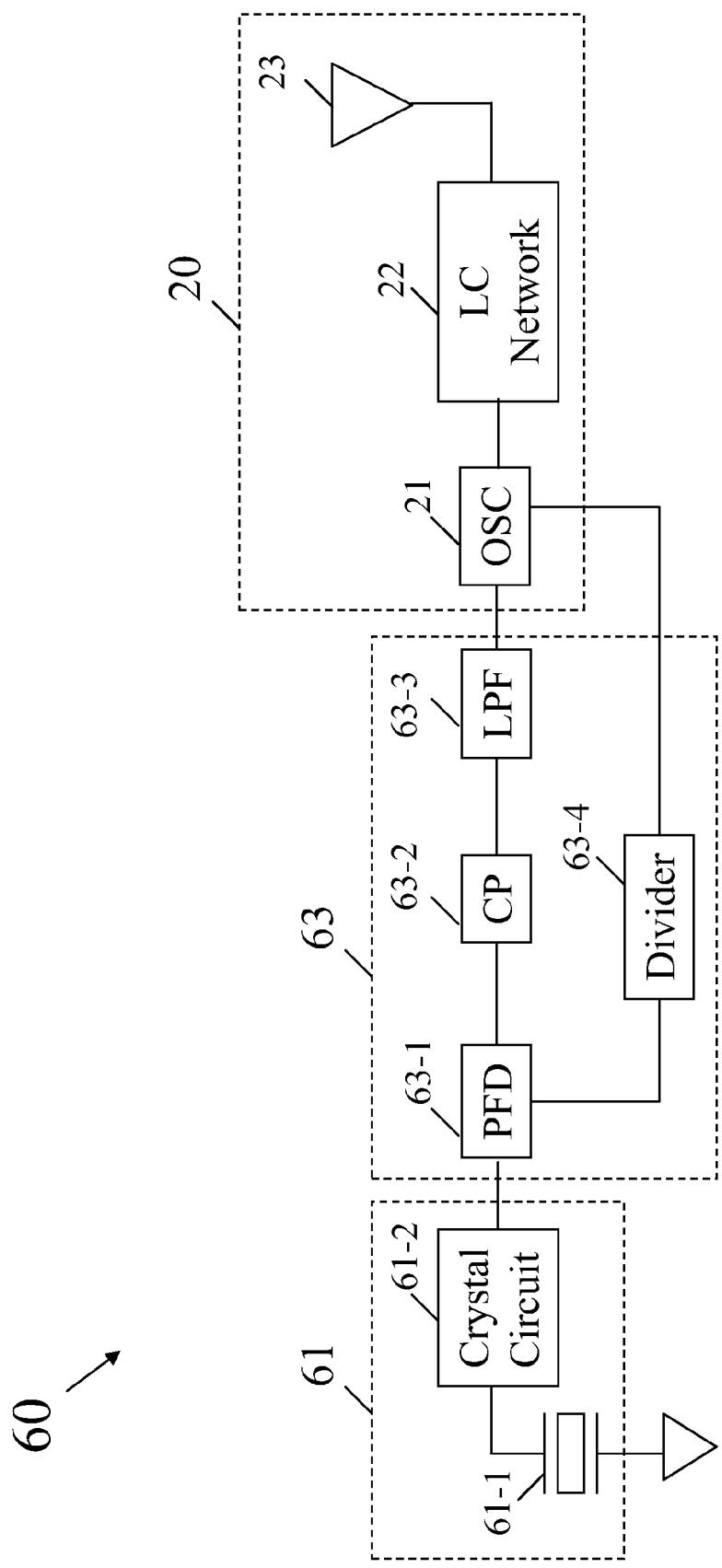
FIG. 6 is a schematic block diagram of a transmitter architecture consistent with an example of the present invention.

FIG. 6 is a schematic block diagram of a transmitter architecture 60 consistent with yet another example of the present invention. Referring to FIG. 6, the transmitter architecture 60 may comprise the carrier generator 20 described and illustrated with reference to FIG. 2, a first oscillator 61 and an adjustment circuit 63. The first oscillator 61 may be configured to generate a first periodic signal at a first frequency of, for example, approximately 1 MHz. In the present example, the first oscillator 61 may include a quartz crystal 61-1 and a crystal circuit 61-2 as illustrated.

The adjustment circuit 63 may include an analog circuit, which further includes a phase-frequency detector (PFD) 63-1, a charge pump (CP) 63-2, a low pass filter (LPF) 63-3 and a frequency divider 63-4. The PFD 63-1 may receive the first periodic signal from the first oscillator 61 and a feedback signal from the oscillator 21 via the frequency divider 63-4 as inputs and generate an output voltage based on the inputs to adjust the carrier frequency through the CP 63-2 and LPF 63-3. The oscillator 21 may be configured to generate a second periodic signal, i.e., a carrier, based on the first periodic signal.

Figure 7A:
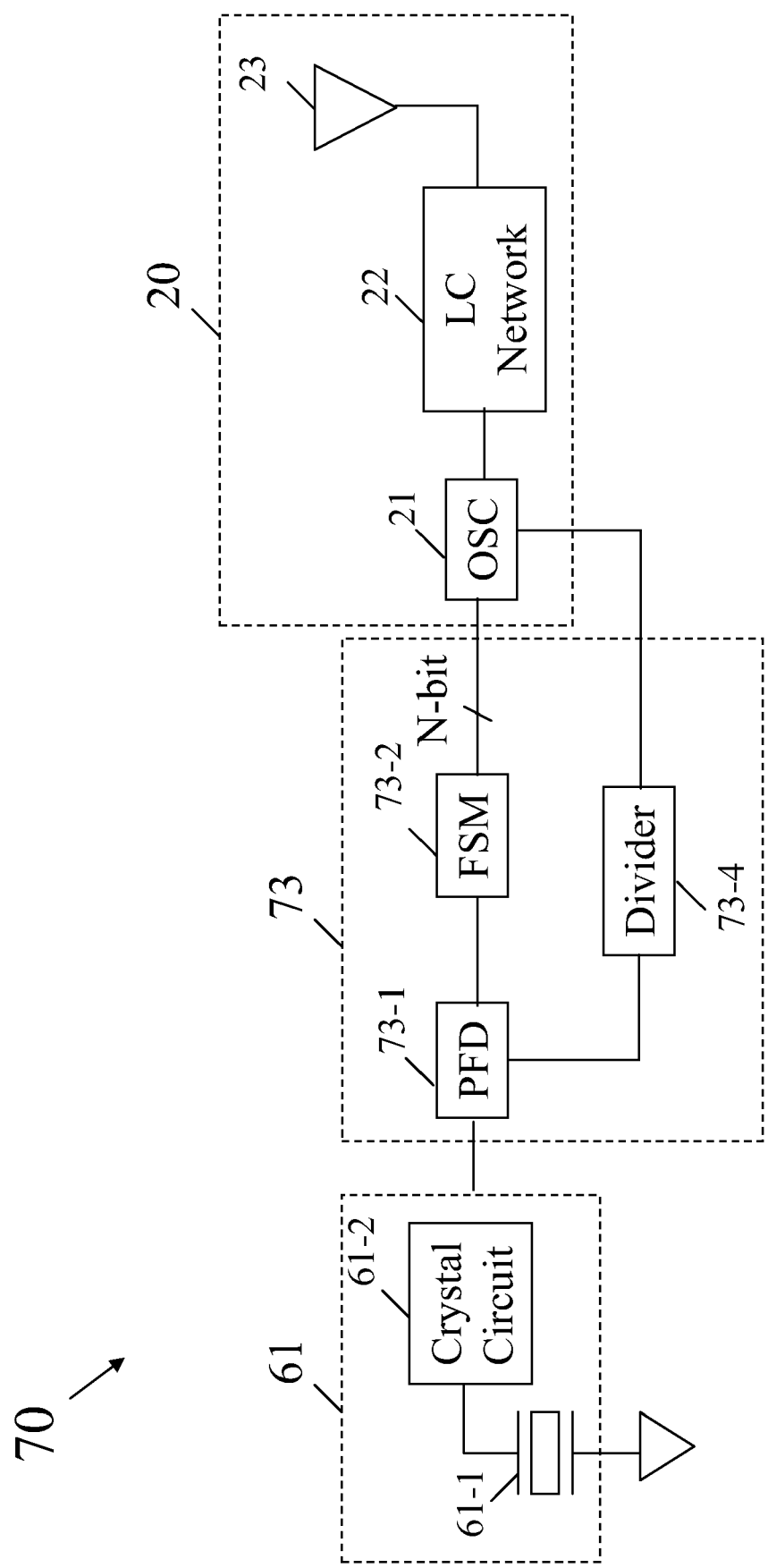
FIG. 7A is a schematic block diagram of a transmitter architecture consistent with another example of the present invention.

FIG. 7A is a schematic block diagram of a transmitter architecture 70 consistent with another example of the present invention. Referring to FIG. 7A, the transmitter architecture 70 may be similar to the transmitter architecture 60 described and illustrated with reference to FIG. 6 except that, for example, an adjustment circuit 73 replaces the adjustment circuit 63. The adjustment circuit 73 may include a digital circuit, which further includes a PFD 73-1, a finite state machine (FSM) 73-2 and a frequency divider 73-4. The PFD 73-1 may include but is not limited to an exclusive-or (XOR) gate, and the FSM 73-2 may include logic gates and flip-flops. The FSM 73-2 may a number of "N" outputs to adjust the carrier frequency of the oscillator 21. In other examples, a time-to-digital converter (TDC) may be used in the transmitter architecture 70 to replace the PFD 73-1.

Figure 7B:
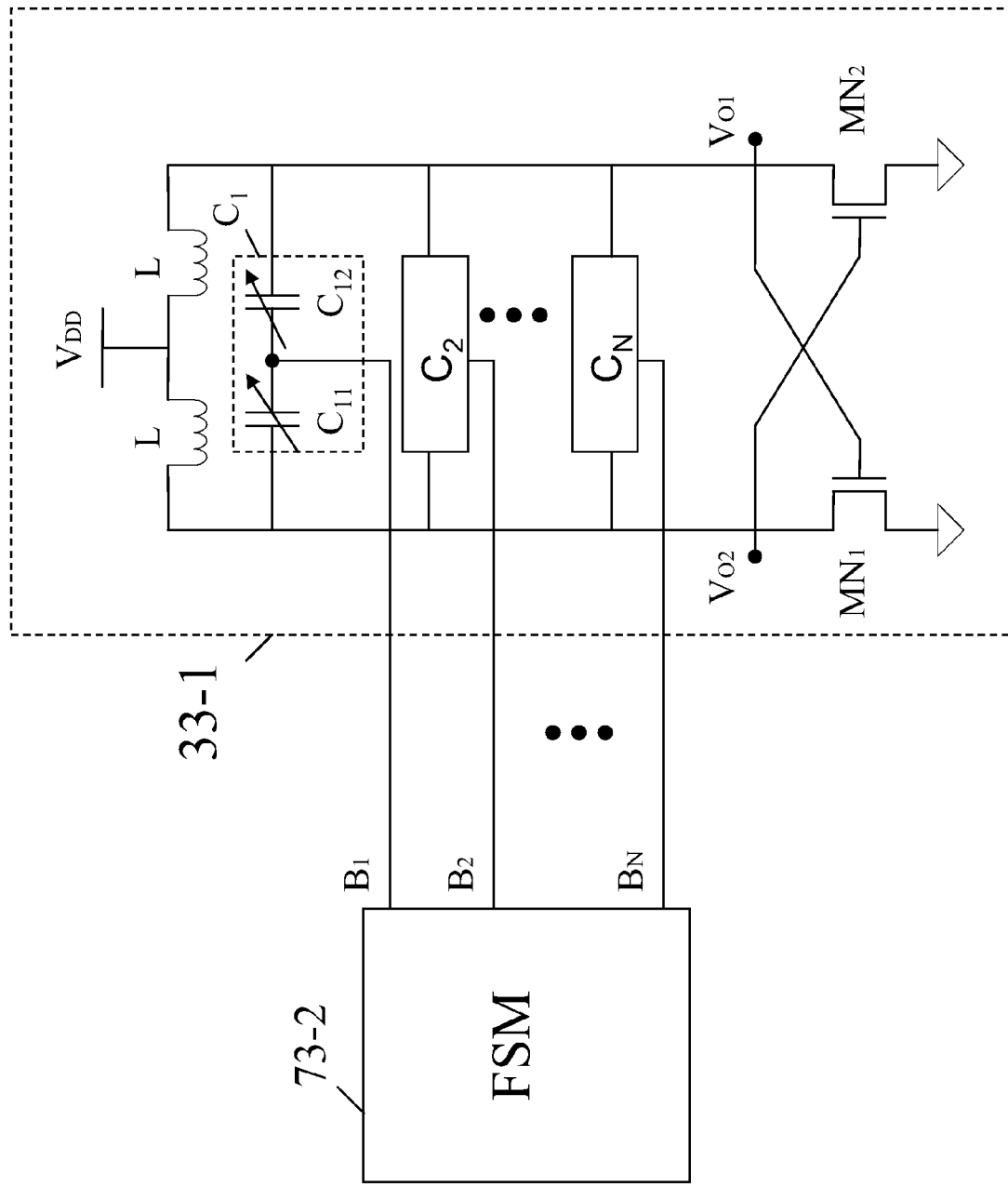
FIG. 7B is a schematic diagram of an exemplary oscillator and finite state machine (FSM) of the transmitter architecture illustrated in FIG. 7A.

FIG. 7B is a schematic diagram of an exemplary oscillator 33-1 and FSM 73-2 of the transmitter architecture 70 illustrated in FIG. 7A. Referring to FIG. 7B, the oscillator 33-1, which may be similar to the oscillator 33 described and illustrated with reference to FIG. 3C, may be adjusted based on a control signal from the FSM 73-2 for frequency selection. Specifically, the control signal may be transmitted via the N outputs $B_1$ to $B_N$, each of which may have a logic one or a logic zero value. Furthermore, the oscillator 33-1 may include a number of N sets of capacitors $C_1$ to $C_N$ coupled in parallel to one another, each of which may further include capacitors coupled in series. As an example of the first capacitor $C_1$, a first capacitor $C_{12}$ and a second capacitor $C_{12}$ may be coupled in series and a point between the first capacitor $C_{11}$ and the second capacitor $C_{12}$ may be coupled to the first bit $B_1$. Given a carrier frequency ranging from 300 to 400 MHz to be generated by the oscillator 33-1 and an 8-bit control signal, i.e., N=8, the value 11111111 from the FSM 73-2 may control the oscillator 33-1 to generate a carrier frequency of 400 MHz and the value 00000000 to generate a carrier frequency of 300 MHz.

Figure 8:
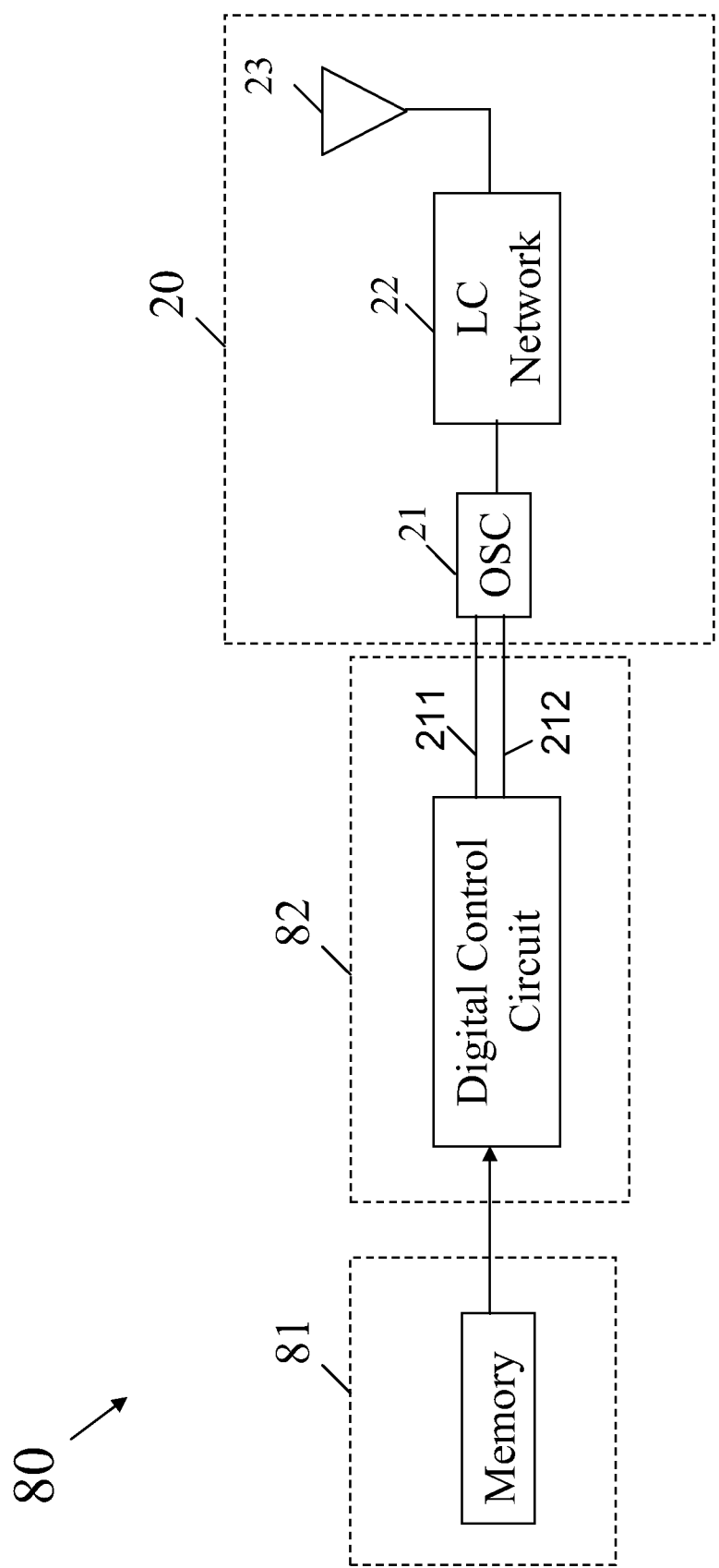
FIG. 8 is a schematic block diagram of a transmitter architecture consistent with still another example of the present invention.

FIG. 8 is a schematic block diagram of a transmitter architecture 80 consistent with still another example of the present invention. Referring to FIG. 8, the transmitter architecture 80 may comprise the carrier generator 20, a digital control circuit 82 and a memory 81. The memory 81 may store predetermined frequency selection signals and modulation data. The digital control circuit 82, electrically connected between the carrier generator 20 and the memory 81, may be configured to retrieve the frequency selection signals from the memory 81 and send the same through the trimming pin 211 to the oscillator 21. In the memory 81, the predetermined frequency selection signals may include, for example, 8-bit digital signals such as 00000000 for a carrier frequency of approximately 300 MHz, 11111111 for a carrier frequency of approximately 400 MHz and other values between 00000000 and 11111111 for a carrier frequency between 300 and 400 MHz. Moreover, the predetermined modulation data may be retrieved from the memory 81 by the digital control circuit 82 and sent in digital bits to the oscillator 21 through the modulation pin 212 for modulation operation.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

We claim:

1. A carrier generator for generating a carrier at a frequency of interest in a wireless communications system, the carrier generator comprising:
   an oscillator exhibiting a first impedance, the oscillator comprising:
      an energy storage tank configured to generate a periodic signal, the energy storage tank including at least one inductor and at least one capacitor; and
      an amplifier coupled with the energy storage tank, the amplifier being configured to amplify an amplitude of the periodic signal;
   an antenna exhibiting a second impedance smaller than the first impedance;
   a memory to store predetermined signals for frequency selection and predetermined modulation data;
   a digital control circuit electrically connected between the memory and the oscillator, the digital control circuit being configured to retrieve the predetermined signals from the memory and send the same to the oscillator through at least one trimming pin, and to retrieve the modulation data from the memory and send the same to the oscillator through at least one modulation pin; and
   a network coupled between the oscillator and the antenna, the network including at least one inductor or at least one capacitor and being configured to provide a third impedance such that a resultant impedance of the second impedance and the third impedance as viewed from the oscillator toward the antenna is large enough to facilitate the oscillator to generate the carrier at the frequency of interest.

2. The carrier generator of claim 1, wherein one of the at least one capacitor of the energy storage tank is a variable capacitor.

3. The carrier generator of claim 1, wherein the at least one trimming pin adjusts the at least one capacitor of the energy storage tank.

4. The carrier generator of claim 1, wherein the oscillator includes a first output coupled to a first sub-network of the network, and a second output coupled to a second sub-network of the network.

5. A carrier generator for generating a carrier at a frequency of interest in a wireless communications system, the carrier generator comprising:
   a first oscillator configured to generate the carrier, the first oscillator exhibiting a first impedance;
   a memory to store predetermined signals for frequency selection and predetermined modulation data;
   a digital control circuit electrically connected between the memory and the first oscillator, the digital control circuit being configured to retrieve the predetermined signals from the memory and send the same to the first oscillator through at least one trimming pin, and to retrieve the modulation data from the memory and send the same to the oscillator through at least one modulation pin;

an antenna exhibiting a second impedance smaller than the first impedance; and a network coupled between the first oscillator and the antenna, the network being configured to provide a third impedance such that a resultant impedance of the second impedance and the third impedance as viewed from the first oscillator toward the antenna facilitates the first oscillator to generate the carrier at the frequency of interest.

6. The carrier generator of claim 5, wherein the first oscillator comprises:

an energy storage tank configured to generate a first periodic signal, the energy storage tank including at least one inductor and at least one capacitor; and an amplifier coupled with the energy storage tank, the amplifier being configured to amplify an amplitude of the first periodic signal to generate the carrier.

7. The carrier generator of claim 5, wherein the first oscillator includes a first output coupled to a first sub-network of the network, and a second output coupled to a second sub-network of the network.

* * * * *